(12) United States Patent
Matsuura

(10) Patent No.: US 7,894,033 B2
(45) Date of Patent: Feb. 22, 2011

(54) SEMICONDUCTOR DEVICE INCLUDING A PARTICULAR DUMMY TERMINAL

(75) Inventor: Kazuyoshi Matsuura, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 1150 days.

(21) Appl. No.: 11/589,180

(22) Filed: Oct. 30, 2006

(65) Prior Publication Data

US 2007/0096344 A1    May 3, 2007

(30) Foreign Application Priority Data

Oct. 31, 2005    (JP) ............... 2005-316540

(51) Int. Cl.
*G02F 1/1345*    (2006.01)
*G09G 3/36*    (2006.01)
*G09G 3/00*    (2006.01)
*H01L 23/48*    (2006.01)

(52) U.S. Cl. ............... 349/149; 349/151; 349/152; 345/98; 345/32; 257/786

(58) Field of Classification Search ............... 349/149, 349/151, 152; 345/98, 32; 257/786
See application file for complete search history.

(56) References Cited

U.S. PATENT DOCUMENTS 6,862,066 B2 * 3/2005 Oowaki et al. ............... 349/139
6,956,548 B2 * 10/2005 Yarita et al. ............... 345/87
7,327,411 B2 * 2/2008 Yoon et al. ............... 349/33
2003/0058205 A1 3/2003 Yarita et al.
2005/0162577 A1 7/2005 Yoon et al.
2005/0285833 A1 12/2005 Yarita et al.

FOREIGN PATENT DOCUMENTS

| | | |
|---|---|---|
| CN | 1410965 A | 4/2003 |
| CN | 1629926 A | 6/2005 |
| JP | 11-183922 | 7/1999 |

OTHER PUBLICATIONS

Chinese Office Action dated Jan. 25, 2008, with partial Japanese and English translations.

* cited by examiner

*Primary Examiner*—Mike Qi
(74) *Attorney, Agent, or Firm*—McGinn IP Law Group, PLLC

(57) ABSTRACT

Keeping more space for circuit elements on a chip when dummy terminals for reinforcement are located on it for the purpose of load balancing for pressure welding. A semiconductor device 10 used for COG-implementation comprising an output terminals group 12*f* arrayed in a first pattern close to one end of a chip, and one or more dummy terminals 12*d* located close to the one end of the chip in a different region from a region where an output terminals group 12*f* is located and arrayed in a second pattern different from the first pattern. The second pattern has a shortened width. A power supply portion 14 is located longitudinally adjacent to an output terminals group 12*f* beside the dummy terminals 12*d*.

20 Claims, 13 Drawing Sheets (EMBODIMENT 1)

(EMBODIMENT 1)

FIG. 2 (EMBODIMENT 2)

FIG. 3 (EMBODIMENT 3)

FIG. 4 (EMBODIMENT 4)

FIG. 5 (EMBODIMENT 5)

FIG . 6 (EMBODIMENT 6)

(EMBODIMENT 7)

(EMBODIMENT 8)

(RELATED ART EXAMPLE 1)

X—X'

(RELATED ART EXAMPLE 1)

(RELATED ART EXAMPLE 1)

Y–Y'
(RELATED ART EXAMPLE 1)

(RELATED ART EXAMPLE 2)

(RELATED ART EXAMPLE 3)

FIG. 13 (RELATED ART EXAMPLE 4)
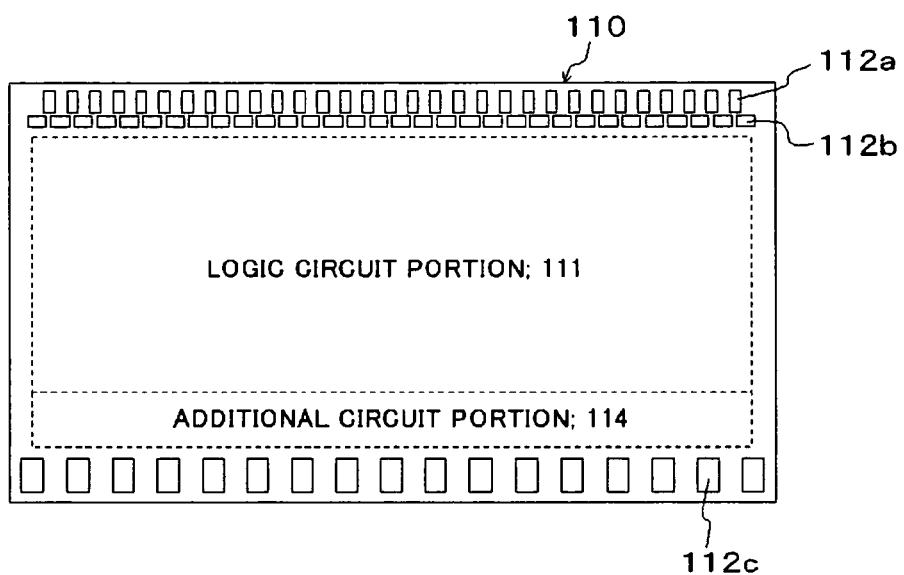

SEMICONDUCTOR DEVICE INCLUDING A PARTICULAR DUMMY TERMINAL

FIELD OF THE INVENTION

The present invention relates to a semiconductor device, more particularly, to a semiconductor device used for COG-implementation.

BACKGROUND OF THE INVENTION

In recent years, liquid crystal panels play a great role as display devices and are utilized in various fields not only for relatively large size displays such as televisions or monitors for personal-computer but also for small size displays like, e.g., mobile phones. In particular, the growth of various kinds of media such as MP3 etc. or mobile games are outstanding, and therefore the necessities of downsizing and reduction of the weight and fabrication cost of the liquid crystal panels are more strongly requested.

As to a driver IC (IC chip) that drives a liquid crystal display, multiple circuits such as driving circuit and power supply circuit are mounted in a single chip recently. To implement the driver IC, besides TAB (Tape Automated Bonding) implementation that connects carrier film mounted with QFP (Quad Flat Package) type and SOP (Small Outline Package) type driver to a liquid crystal panel, COG (Chip on Glass) implementation that implements the driver IC directly onto a glass substrate of the liquid crystal panel is increasing. The COG-implementation can realize fine connection pitch of pins so as to provide a liquid crystal display with higher-resolution, thinner-body, lighter-weight and smaller size. Also, it is expected that liquid crystal displays will be fabricated at lower cost by reducing fabrication materials and fabrication steps.

SUMMARY OF THE DISCLOSURE

A COG-implementation is explained using drawings. FIG. 9 illustrates a structure of semiconductor device (IC chip) according to related art example 1, and (a) is a plan view of the reverse side and (b) is a partial cross-sectional view of X-X' of the semiconductor device. FIG. 10 illustrates a structure of semiconductor device (IC chip) that is COG-implemented onto a glass substrate according to related art example 1, and (a) is a plan view and (b) is a partial cross-sectional view of Y-Y' of the semiconductor device.

To perform COG-implementation, bumps 113 (e.g. a metal, Au) are formed on terminals 112 of an IC chip 110 for COG-implementation (see FIG. 9). An anisotropic conductive film (ACF) 120 containing electric conductive particles 122 distributed in an adhesive 121 is disposed between the IC chip 110 and a glass substrate 130 and pressurized under heating using a tool (not shown), whereby the terminals 112 of the IC chip 110 are electrically connected to terminals 131 formed on the glass substrate 130 via the bumps 113 and the electrical conductive particles 122, and at the same time the adhesive 121 securely fixes the region between the terminals 112 and 131 (see FIG. 10). To perform COG-implementation, load balancing is very important for pressure welding. If a device not balanced be implemented, load is applied in a biased fashion over the device by a tool (not shown) and may cause chip cracking, cutting off of conducting paths (not shown) on the glass substrate 130, or non-conductivity between the terminals 112 and 131 when the ACF 120 is not collapsed sufficiently. Therefore, to design the array of terminals, sizes and the number of terminals must be determined so as to keep a predetermined terminal area at one chip taking the connecting strength and connecting resistance into account, and the terminals location must be arrayed keeping its balance so as not to incline the chip during its implementation.

Next, related art IC chips integrating multiple circuits in a single chip are explained using drawings. FIGS. 11 to 13 are plan views illustrating structures of reverse sides of semiconductor devices (IC chips) according to related art examples 2 to 4.

Referring to FIG. 11 (related art example 2), this IC chip 110 has two staggered (checkerboard like) banks of first output terminals 112a and second output terminals 112b in the vicinity of one side in the longitudinal direction of the chip on the reverse side and one bank of input terminals 112c in the vicinity of the other side of the chip on the reverse side. The logic circuit portion 111 and the additional circuit portion 114 are located side by side in the lateral direction between the second output terminals 112b and the input terminals 112c. The longitudinal length of the chip is determined by the number of output terminals.

Referring to FIG. 12 (related art example 3), this IC chip 110 has first output terminals 112a, second output terminals 112b and input terminals 112c likewise the array of the related art example 2, and the logic circuit portion 111 and an additional circuit portion 114 are located longitudinally in series between the second output terminals 112b and the input terminals 112c. The additional circuit portion 114 is located under restriction for real use. In the vicinity of the additional circuit portion 114, because of a problem for implementation, two staggered banks of dummy terminals 112d for reinforcement are located in the same manner as the first output terminals 112a and the second output terminals 112b, and additional terminals 112e are located in the same manner as the input terminals 112c. According to the related art example 3, the chip size in the lateral direction can be reduced compared to the related art example 2, and reduction of contacting resistance is possible by increase in the number of input terminals so as to increase the area of the terminals.

Referring to FIG. 13 (related art example 4), this IC chip 110 has second output terminals 112b in a longitudinally elongated rectangular shape as disclosed in Patent Document 1. The second output terminals 112b keep determined area needed for connecting strength and connecting resistance, and by shortening the vertical (in the figure) length of each second output terminal 112b in keeping the width of each first input terminal 112a and the distance of the gap between them, it makes possible to expand an area used for layout in IC chip 110.

[Patent Document 1]
JP Patent Kokai Publication No. JP-A-11-183922

Such a structure as related art IC chip can obtain wide area for implementation of chips and reduce the number of parts, however, it is difficult to reduce fabrication cost by using multi-panels layout. In addition, in case of IC chips having dummy terminals, an inside area of the chip for layout is limited by second output terminals (112b of FIG. 12).

To explain in detail, COG-implementation can reduce the number of parts, however, there is a problem that reduction of fabrication cost by multi-panels layout on the glass substrate is difficult because the method requires large area to implement chips on the glass substrate. In the future, development of a technique to integrate multiple circuits in a single chip is expected and when additional circuit elements are implemented for additional functions, such a structure to increase a chip size in lateral (vertical) direction as related art example 2

(see FIG. 11) or 4 (see FIG. 13) causes larger unnecessary area on a glass substrate for implementation. Instead of these examples, it will be possible to locate additional circuits in longitudinal (horizontal) direction under restriction for real use as shown in related art example 3 (see FIG. 12) and decrease unnecessary area on the glass substrate, a large number of terminals must be located to solve a problem for implementation. When the number of input terminals are increased, there is an advantage to reduce contacting resistance by arrangement of the numbers of the terminals, however, in case output terminals are increased, dummy terminals for reinforcement should be increased to eliminate imbalances between these terminals. In related art example 3, output terminals 112a and 112b are located in staggered pattern, therefore dummy terminals 112d are also located staggered. In this case inside terminals of the dummy terminals narrow an area for layout of circuit elements (see FIG. 12). Consequently an increase in chip size larger than an area for additional circuits portion 114 is necessary and most effective fabrication cost reduction cannot be achieved.

It is a main object of the present invention to provide a semiconductor device that can mount more circuit elements on a chip even when dummy terminals for reinforcement are located on it for the purpose of load balancing during pressure welding.

In one aspect of the present invention, there is provided a semiconductor device comprising: a group of terminals arrayed in a first pattern close to one end of a chip, and one or more dummy terminals located close to the one end of the chip in a different region from a region where the group of terminals is located and arrayed in a second pattern that is different from the first pattern.

Preferably, the second pattern has a shortened width in a lateral direction compared with the first pattern.

Preferably, a circuit elements portion is located longitudinally adjacent to the group of terminals close to the dummy terminals.

It is preferred that the dummy terminals are located at one side longitudinally adjacent to the group of terminals.

The dummy terminals may be located between a first part of the group of terminals and a second part of the group of terminals.

The dummy terminals may be located at both sides longitudinally adjacent to the group of terminals.

A circuit elements portion may be located between the dummy terminals and the group of terminals.

The group of terminals may be arrayed in a staggered pattern.

The group of terminals may be assigned to an output terminals group or an input terminals group, or both thereof.

The semiconductor device is adapted to COG-implementation.

The meritorious effects of the present invention are summarized as follows.

According to the present invention, additional functions can be added without changing a chip size. And the invention can increase degree of freedom for layout and improve capacities and/or functions of a chip. In other words, an area of a circuit portion can be enlarged by changing the array of signal receiving dummy terminals.

BRIEF DESCRIPTIONS OF THE DRAWINGS

FIG. 13 is a plan view of the reverse side illustrating the structure of a semiconductor device (IC chip) according to a related art example 4.

PREFERRED EMBODIMENTS OF THE INVENTION

Embodiment 1

Figure 1:
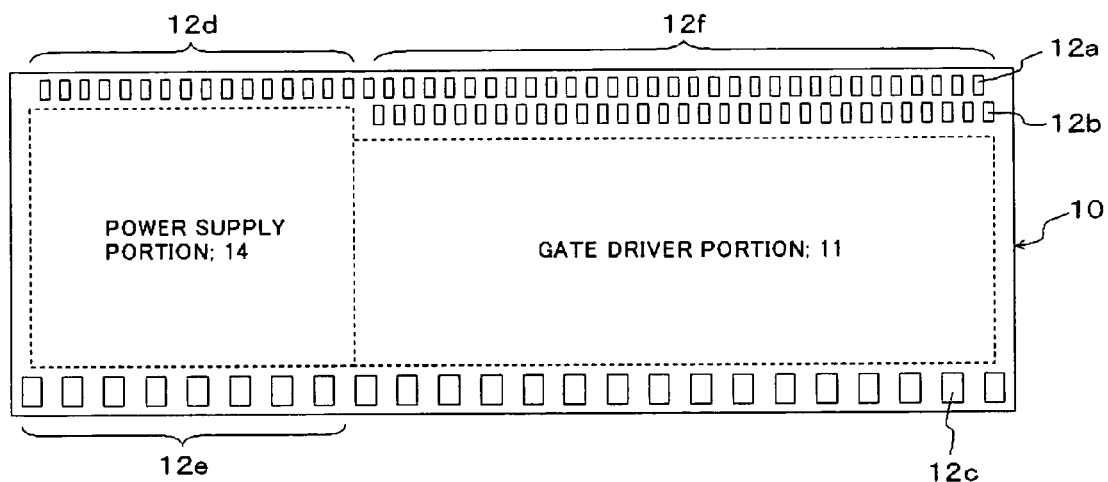
FIG. 1 is a plan view of the reverse side illustrating the structure of a semiconductor device according to embodiment 1 of the present invention.

A semiconductor device according to embodiment 1 of the present invention is explained using a drawing. FIG. 1 is a plan view of the reverse side illustrating the structure of a semiconductor device according to embodiment 1 of the present invention.

A gate driver IC chip containing driving power supply for liquid crystal is exampled as a semiconductor device 10. A gate driver portion 11 and a power supply portion 14 are located side by side in the longitudinal direction of the semiconductor device 10. The semiconductor device 10 has two staggered banks of first output terminals 12a and second output terminals 12b close to (along) one end extending in the longitudinal direction of the gate driver portion 11 on the reverse side and one bank of input terminals 12c close to (along) the other end extending in the longitudinal direction on the reverse side. The semiconductor device 10 has also one bank of dummy terminals 12d likewise the first output terminals 12a close to (along) the one end in the longitudinal direction of the power supply portion 14 on the reverse side and one bank of additional terminals 12e likewise the input terminals 12c close to (along) the other end extending in the longitudinal direction of the power supply portion 14 on the reverse side. The semiconductor device 10 has no dummy terminals corresponding to the second output terminals 12b along the one end in the longitudinal direction of the power supply portion 14, and layout region of the power supply portion 14 is expanded up to the area corresponding to the second output terminals 12b.

The dummy terminals 12d are mainly located to keep a loading balance of the chip during pressure welding. This dummy terminals 12d can vary the size or shape from those of terminals usually needed for signal or power transmission. Generally the dummy terminals 12d are not connected to circuit elements or external pads on the chip. However, electrical power can be supplied to the circuit elements on the chip via the dummy terminals 12d.

According to embodiment 1, the area of a chip can be reduced because a region for output terminals 12a and 12b of the gate driver portion 11 can be narrowed in the lateral (vertical in the figure) direction by arranging the terminals in staggered (like checkerboard) pattern. Beside that, by arranging the dummy terminals 12d in one bank keeping its determined area, it becomes possible to expand layout region up to the second bank of the dummy terminals region compared to a conventional staggered arrangement of dummy terminals like the output terminals 12a and 12b of the gate driver portion 11, and consequently unnecessary area of a glass substrate can be reduced.

The expansion of the layout region makes it easier to add functions. For instance, the size of output transistors, e.g. amplifiers, can be enlarged in a power supply portion. And thus, it makes possible to design an IC of higher load current capacity without changing the chip size.

In addition, there is a possibility to realize conflicting purposes at the same time of both improvement of functions and downsizing of the chip size due to the increase of degree of freedom of layout.

Embodiment 2

Figure 2:
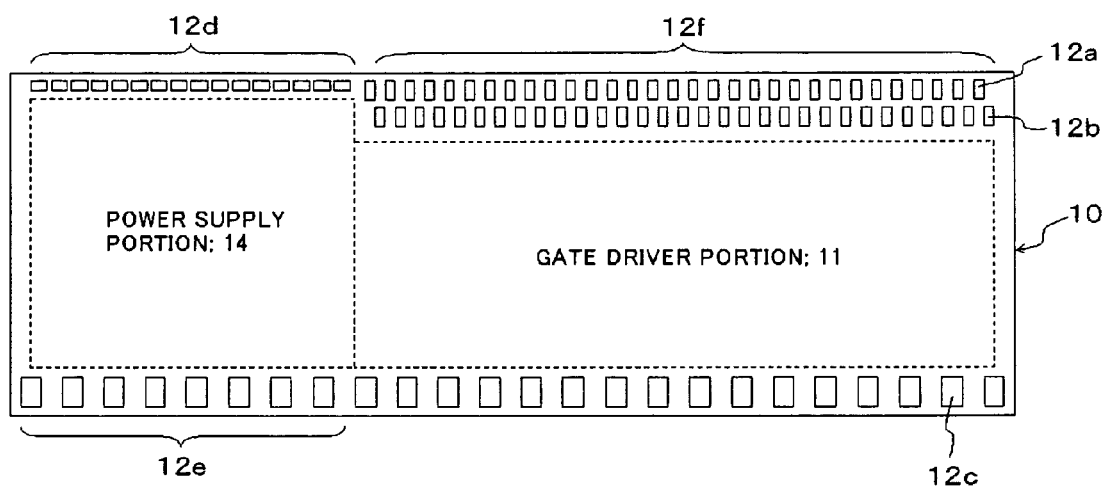
FIG. 2 is a plan view of the reverse side illustrating the structure of a semiconductor device according to embodiment 2 of the present invention.

A semiconductor device according to embodiment 2 of the present invention is explained using a drawing. FIG. 2 is a plan view of the reverse side illustrating the structure of a semiconductor device according to embodiment 2 of the present invention. A semiconductor device 10 according to embodiment 2 is an improved version of embodiment 1 and the width of each dummy terminal 12d is shortened in the lateral (vertical) direction of the substrate compared to a first output terminal 12a keeping its determined (or required) area of the dummy terminals 12d. According to embodiment 2, less number of gaps between terminals compared to embodiment 1 achieves reduction of the size of each dummy terminal in the lateral direction of the substrate, and a layout region of the chip can be expanded. As a result, the capacity of power supply portion 14 can be improved.

Embodiment 3

Figure 3:
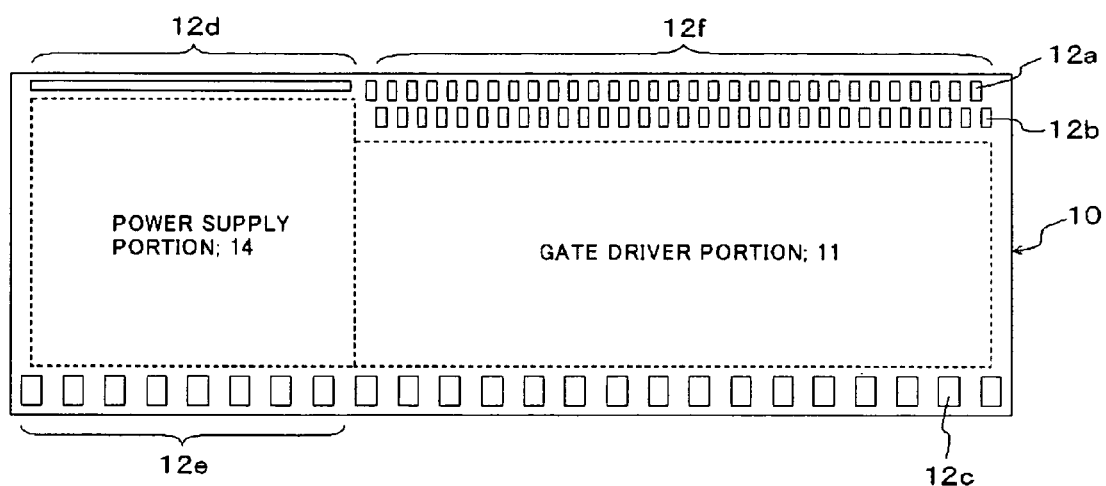
FIG. 3 is a plan view of the reverse side illustrating the structure of a semiconductor device according to embodiment 3 of the present invention.

A semiconductor device according to embodiment 3 of the present invention is explained using a drawing. FIG. 3 is a plan view of the reverse side illustrating the structure of a semiconductor device according to embodiment 3 of the present invention. A semiconductor device 10 according to embodiment 3 is an improved version of embodiment 2 and a dummy terminal 12d is configured to a single terminal elongated in the longitudinal direction of the substrate keeping its determined area. According to embodiment 3, the same effects as embodiment 2 can be achieved.

Embodiment 4

Figure 4:
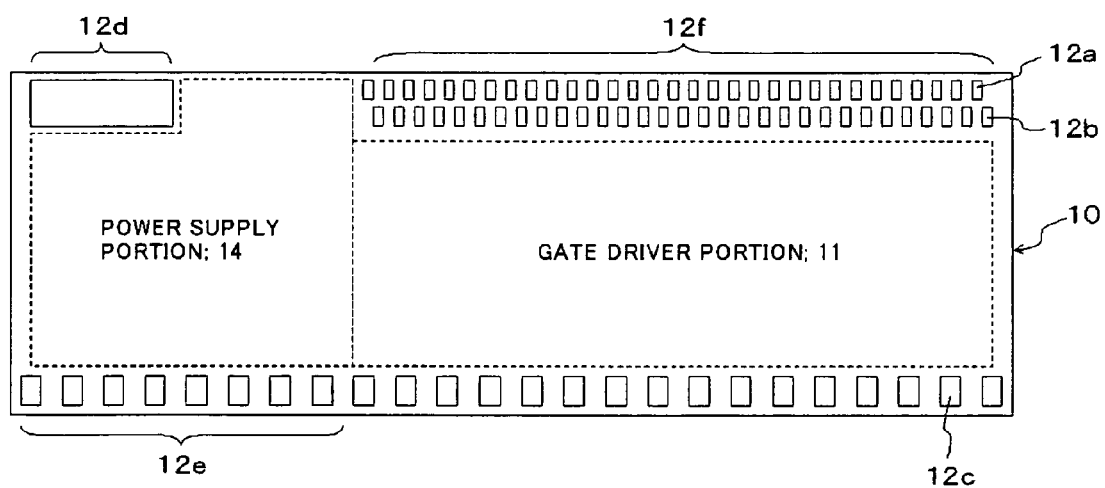
FIG. 4 is a plan view of the reverse side illustrating the structure of a semiconductor device according to embodiment 4 of the present invention.

A semiconductor device according to embodiment 4 of the present invention is explained using a drawing. FIG. 4 is a plan view of the reverse side illustrating the structure of a semiconductor device according to embodiment 4 of the present invention. In a semiconductor device 10 according to embodiment 4, the layout region of power supply portion 14 is also expanded up to the bank area of the first output terminals 12a keeping the determined area of dummy terminals 12d. According to embodiment 4, most effective region for layout design can be utilized and the improvement of the capacity of power supply region can be achieved.

Embodiments 5 to 7

Figure 5:
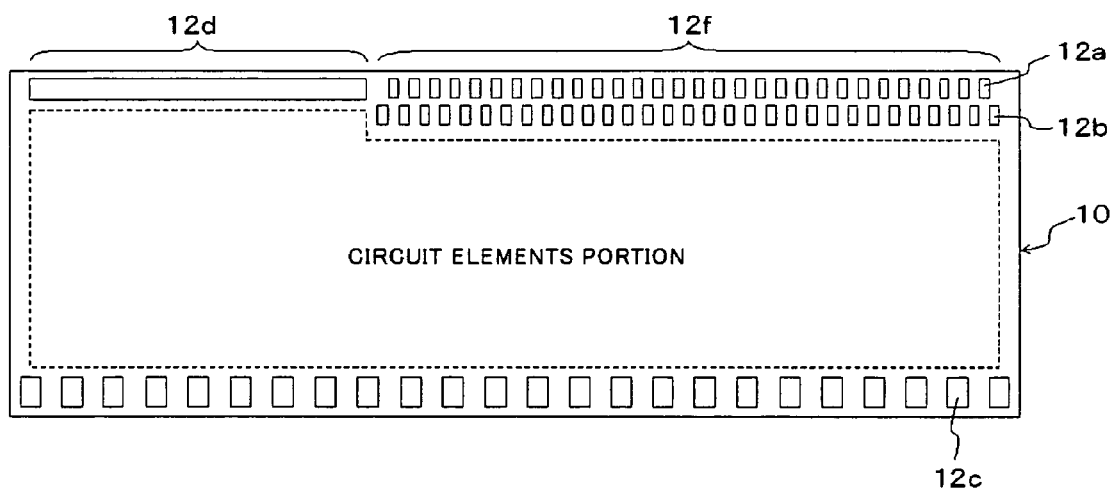
FIG. 5 is a plan view of the reverse side illustrating the structure of a semiconductor device according to embodiment 5 of the present invention.
Figure 6:
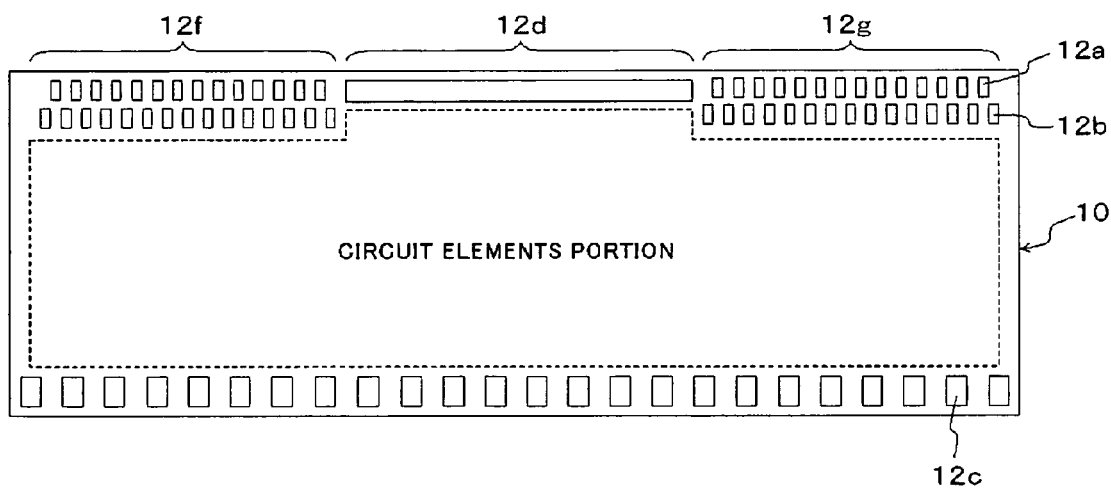
FIG. 6 is a plan view of the reverse side illustrating the structure of a semiconductor device according to embodiment 6 of the present invention.
Figure 7:
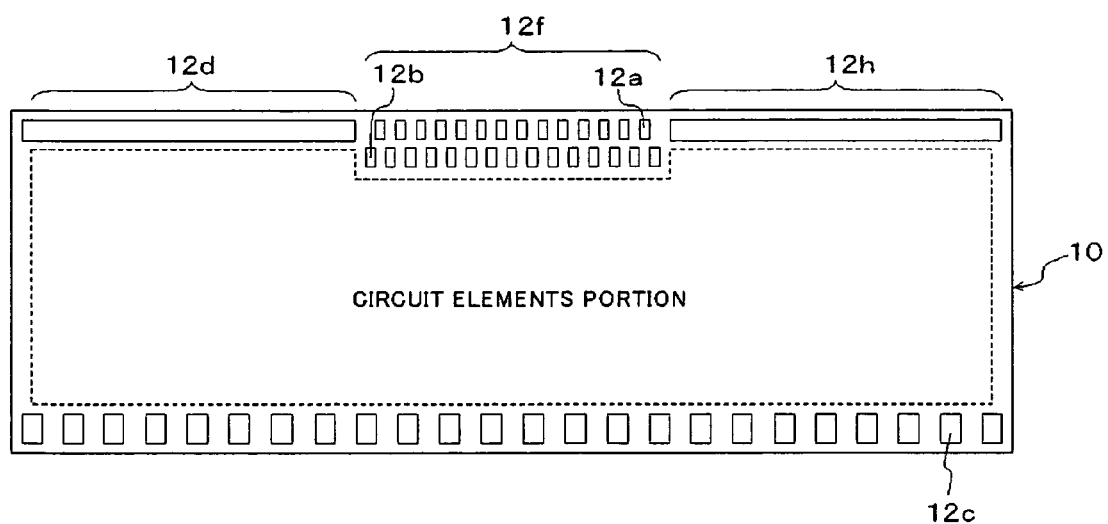
FIG. 7 is a plan view of the reverse side illustrating the structure of a semiconductor device according to embodiment 7 of the present invention.

Semiconductor devices according to embodiments 5 to 7 of the present invention are explained using drawings. FIGS. 5 to 7 are plan views of the reverse side illustrating the structures of semiconductor devices according to embodiments 5 to 7 of the present invention.

A semiconductor device 10 according to embodiment 5 has a construction that both the output terminal group 12f, comprising output terminals 12a and 12b, and dummy terminals 12d are located side by side in the longitudinal direction of the substrate along one side thereof for the effective layout design of a circuit elements portion without limitation to a gate driver IC containing power supply (see FIG. 5).

A semiconductor device 10 according to embodiment 6 has a construction that a dummy terminal(s) 12d is/are located (at a central area) between output terminal groups 12f and 12g, both comprised of output terminals 12a and 12b, for the effective layout design of a circuit elements portion without limitation to a gate driver IC containing power supply (see FIG. 6).

A semiconductor device 10 according to embodiment 7 has a construction that the output terminal group 12f comprised of output terminals 12a and 12b are located (at a central area) between dummy terminals 12d and 12h for the effective layout design of a circuit elements portion without limitation to a gate driver IC containing power supply (see FIG. 7).

According to embodiments 5 to 7, the combination of two portions, a portion of two staggered banks of terminals to produce an effective layout space (output terminals group) and a portion of one straight bank of terminals to produce an effective layout space (dummy terminals group), enables IC-designs that provide various kinds of capacities and functions without enlargement of a chip size.

Embodiment 8

Figure 8:
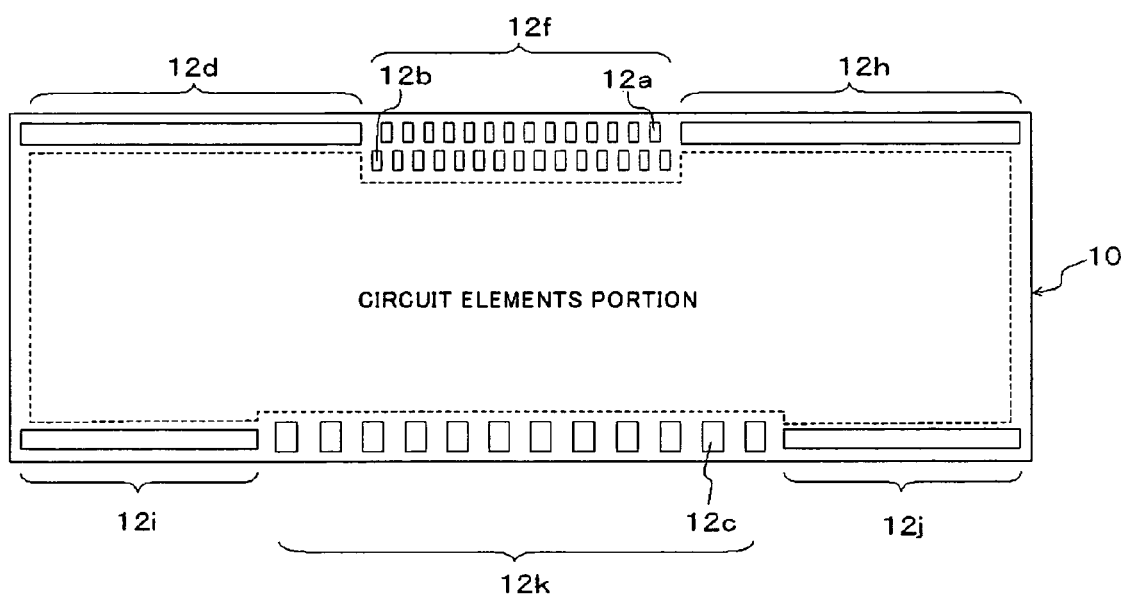
FIG. 8 is a plan view of the reverse side illustrating the structure of a semiconductor device according to embodiment 8 of the present invention.
Figure 9A:
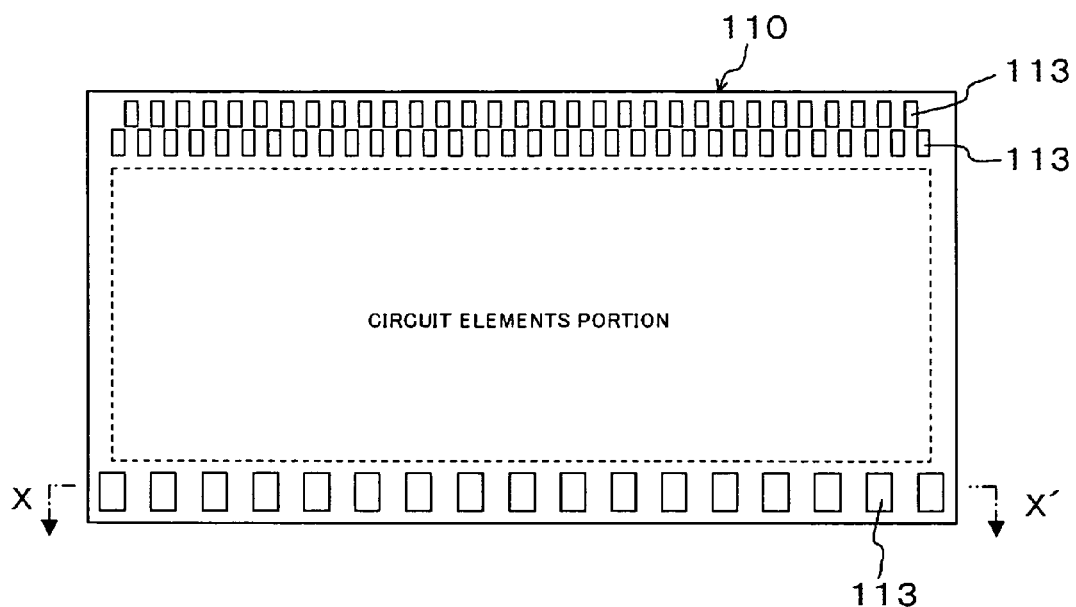
FIGS. 9A and 9B illustrate an outline of the structure of a semiconductor device (IC chip) according to a related art example 1 and FIG. 9A is a plan view of the reverse side and FIG. 9B is a partial cross-sectional view of X-X' of the semiconductor device.
Figure 9B:
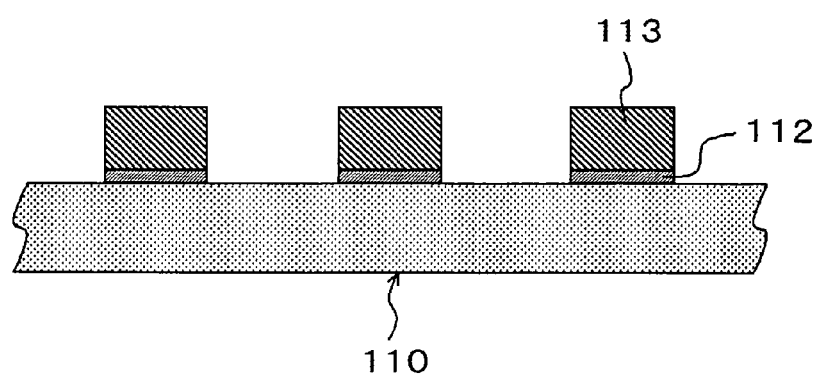
Figure 10A:
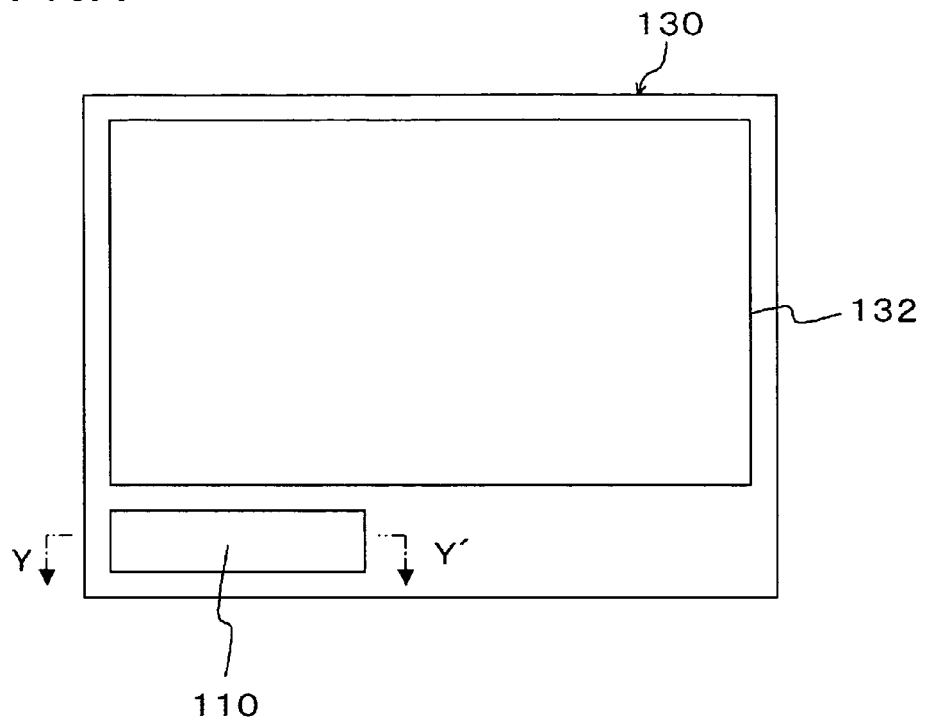
FIGS. 10A and 10B illustrate an outline of the structure of a semiconductor device (IC chip) that is COG-implemented on a glass substrate according to a related art example 1 and FIG. 10A is a plan view and FIG. 10B is a partial cross-sectional view of Y-Y'.
Figure 10B:
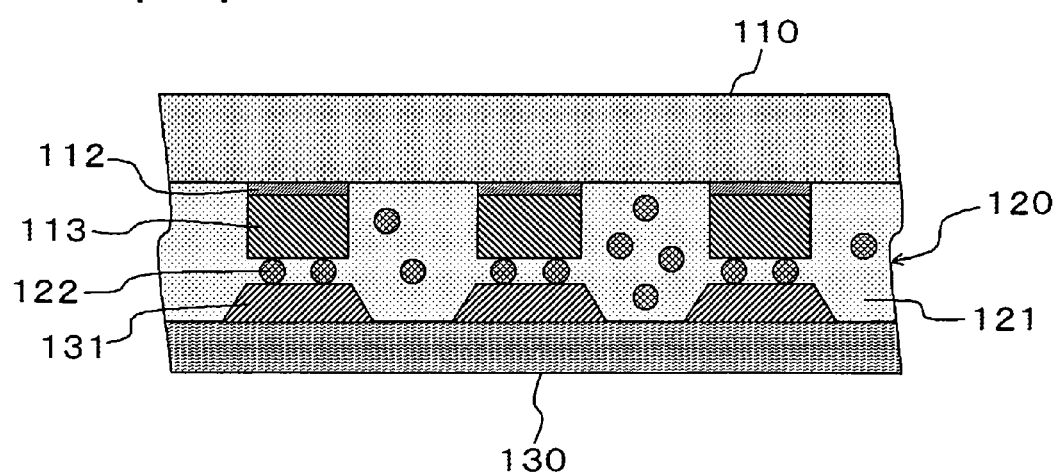
Figure 11:
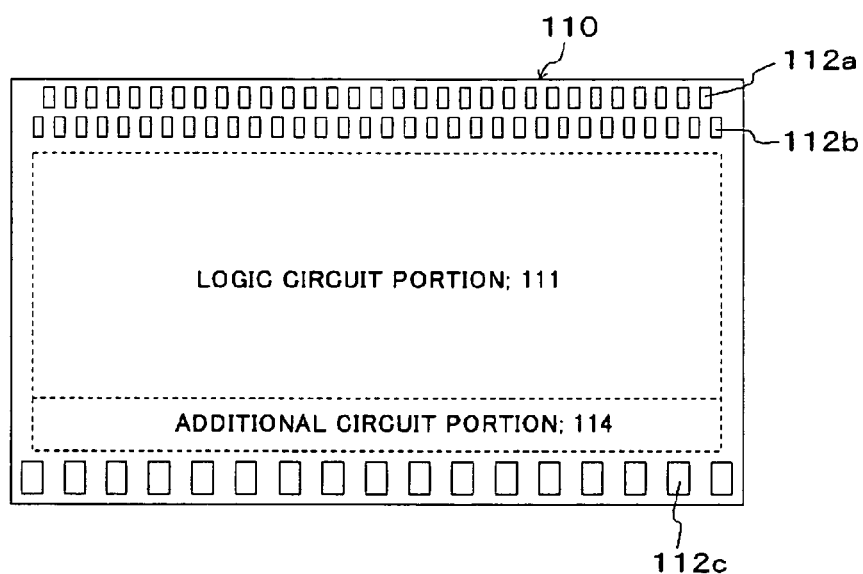
FIG. 11 is a plan view of the reverse side illustrating the structure of a semiconductor device (IC chip) according to a related art example 2.
Figure 12:
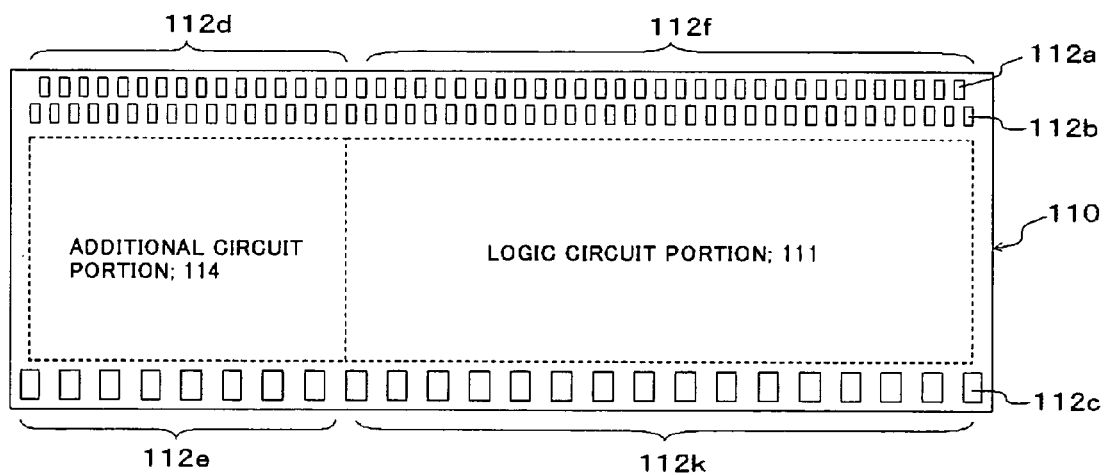
FIG. 12 is a plan view of the reverse side illustrating the structure of a semiconductor device (IC chip) according to a related art example 3.

A semiconductor device according to embodiment 8 of the present invention is explained using a drawing. FIG. 8 is a plan view of the reverse side illustrating the structure of a semiconductor device according to embodiment 8 of the present invention. In a semiconductor device 10 according to embodiment 8, dummy terminals 12i and 12j are located at both sides of an input terminals group 12k similar to the side of an output terminals group 12f. According to embodiment 8, as to the side of input terminals group 12k, the shape (and arrangement) of dummy terminals 12i and 12j can also be optimized in view of its chip balance and area so that further expansion of chip's functions is realized.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
   a group of terminals arrayed in a first pattern close to one end of a chip; and
   a dummy terminal located close to said one end of the chip and in a different region from a region where said group of terminals is located, said dummy terminal being formed in a second pattern that is different from said first pattern.

2. The semiconductor device as defined in claim 1, wherein said second pattern has a width in a lateral direction that is less than a width of said first pattern in said lateral direction.

3. The semiconductor device as defined in claim 1, wherein a circuit elements portion is located laterally adjacent to said group of terminals and close to said dummy terminal.

4. The semiconductor device as defined in claim 1, wherein said dummy terminal is located longitudinally adjacent to one side of said group of terminals.

5. The semiconductor device as defined in claim 1, wherein said dummy terminal is located between a first part of said group of terminals and a second part of said group of terminals.

6. The semiconductor device as defined in claim 1, wherein said dummy terminal comprises a plurality of dummy terminals arrayed in said second pattern, and
   wherein said group of terminals is disposed between said plurality of dummy terminals.

7. The semiconductor device as defined in claim 6, further comprising:
   a group of input terminals located close to an other end of said chip that is opposite to said end of said chip; and
   a plurality of input dummy terminals located close to said other end of said chip,
   wherein said group of input terminals is disposed between said plurality of input dummy terminals.

8. The semiconductor device as defined in claim 7, wherein a lateral width of said group of input terminals is greater than a lateral width of said plurality of input dummy terminals.

9. The semiconductor device as defined in claim 7, further comprising:
   a circuit elements portion disposed close to longitudinal ends of said chip and between said one end and said other end of said chip,
   wherein a lateral width of said circuit elements portion between said plurality of input dummy terminals and said plurality of dummy terminals is greater than a lateral width of said circuit elements portion between said group of terminals and said group of input terminals.

10. The semiconductor device as defined in claim 9, wherein said lateral width of said circuit elements portion between said plurality of input dummy terminals and said plurality of dummy terminals is greater than a lateral width of said circuit elements portion between said plurality of dummy terminals and said group of input terminals.

11. The semiconductor device as defined in claim 9, wherein a lateral width of said circuit elements portion between said plurality of dummy terminals and said group of input terminals is greater than said lateral width of said circuit elements portion between said group of terminals and said group of input terminals.

12. The semiconductor device as defined in claim 1, wherein a circuit elements portion is located between said one end of said chip on which said dummy terminal and said group of terminals are located at an other end of said chip on which an other group of terminals is located.

13. The semiconductor device as defined in claim 1, wherein said group of terminals is arrayed in a staggered pattern.

14. The semiconductor device as defined in claim 1, wherein said group of terminals is assigned to at least one of an output terminals group and an input terminals group.

15. The semiconductor device as defined in claim 1, wherein said semiconductor device is adapted to COG-implementation.

16. The semiconductor device as defined in claim 1, wherein said group of terminals comprises a bank of first output terminals and a bank of second output terminals, a location of said bank of first output terminals being nearer to said one end of said chip than a location of said bank of second output terminals, and
   wherein a location of said dummy terminal corresponds longitudinally to said location of said bank of first output terminals.

17. The semiconductor device as defined in claim 1, wherein said group of terminals comprises a bank of first output terminals and a bank of second output terminals, a location of said bank of first output terminals being nearer to said one end of said chip than a location of said bank of second output terminals, and
   wherein a longitudinal plane on which said dummy terminal is located corresponds with a longitudinal plane on which said bank of first output terminals are located.

18. The semiconductor device as defined in claim 16, wherein a lateral width of said bank of first output terminals is greater than a lateral width of said dummy terminal.

19. The semiconductor device as defined in claim 1, wherein a circuit elements portion is disposed between said dummy terminal and said group of terminals.

20. The semiconductor device as defined in claim 1, wherein a longitudinal plane on which said dummy terminal is located corresponds with a longitudinal plane on which said group of terminals is located.

* * * * *